US010014866B2

(12) United States Patent
Vasudevan et al.

(10) Patent No.: US 10,014,866 B2
(45) Date of Patent: Jul. 3, 2018

(54) CLOCK ALIGNMENT SCHEME FOR DATA MACROS OF DDR PHY

(71) Applicant: Invecas, Inc., Santa Clara, CA (US)

(72) Inventors: Narasimhan Vasudevan, San Diego, CA (US); Venkata N. S. N. Rao, Fremont, CA (US); Prasad Chalasani, San Jose, CA (US)

(73) Assignee: Invecas, Inc., Santa Clara, CA (US)

( * ) Notice: Subject to any disclaimer, the term of this patent is extended or adjusted under 35 U.S.C. 154(b) by 0 days.

(21) Appl. No.: 15/707,205

(22) Filed: Sep. 18, 2017

(65) Prior Publication Data

US 2018/0006656 A1 Jan. 4, 2018

Related U.S. Application Data

(63) Continuation of application No. 15/192,594, filed on Jun. 24, 2016, now Pat. No. 9,954,538.

(51) Int. Cl.
*H03L 7/06* (2006.01)
*H03L 7/081* (2006.01)
*G11C 11/4063* (2006.01)
*H03L 7/083* (2006.01)
*G11C 7/22* (2006.01)
*H03L 7/091* (2006.01)

(52) U.S. Cl.
CPC ............ *H03L 7/0818* (2013.01); *G11C 7/222* (2013.01); *G11C 11/4063* (2013.01); *H03L 7/083* (2013.01); *H03L 7/091* (2013.01)

(58) Field of Classification Search
CPC ..... H03L 7/081; H03L 7/0812; H03L 7/0814; H03L 7/0816; H03L 7/0818; H03L 7/091; G11C 11/4063; G11C 7/222

USPC ........................................... 327/158
See application file for complete search history.

(56) References Cited

U.S. PATENT DOCUMENTS

| | | | | |
|---|---|---|---|---|
| 6,643,787 B1 * | 11/2003 | Zerbe | ........................ | G06F 1/10 713/400 |
| 6,680,634 B1 * | 1/2004 | Ruha | ..................... | H03L 7/0812 327/149 |
| 6,741,522 B1 * | 5/2004 | Lin | .......................... | G11C 7/22 327/141 |
| 2012/0049914 A1 * | 3/2012 | Pellerano | .............. | H03L 7/1974 327/158 |
| 2012/0249200 A1 | 10/2012 | Yu | | |

* cited by examiner

*Primary Examiner* — Patrick Chen
(74) *Attorney, Agent, or Firm* — Venture Pacific Law, PC

(57) ABSTRACT

A master-slave delay locked loop system comprises a master delay locked loop ("MDLL") for generating at least one bias voltage and at least one slave delay locked loop ("SDLL"). The at least one SDLL is coupled to the MDLL, where the at least one SDLL comprises an analog to digital converter for converting the at least one bias voltage to at least one digital signal, an adder/subtractor block for adjusting the at least one digital signal based on at least one control signal, a digital to analog converter for converting the at least one adjusted digital signal to at least one analog signal, a voltage to current converter for converting the at least one analog signal to at least one bias current, delay elements for generating phase delayed signals based on the at least one bias current, and a phase detector and control logic for determining any phase difference between the phase delayed signals and for generating the at least one control signal to align the phase delayed signals.

19 Claims, 5 Drawing Sheets

CLOCK ALIGNMENT SCHEME FOR DATA MACROS OF DDR PHY

CROSS REFERENCE

This application claims priority from a provisional patent application entitled "Clock Alignment Scheme for Data Macros of DDR PHY" filed on Jun. 24, 2016 and having application Ser. No. 15/192,594. Said application and any other referenced patents or patent applications herein are incorporated in its entirety by reference.

FIELD OF INVENTION

This invention generally relates to a clock alignment scheme for an integrated circuit, and, in particular, to circuits, methods, and systems for clock alignment by a master-slave delay locked loop network.

BACKGROUND

In a high speed source-synchronous semiconductor memory system, such as a double data rate synchronous dynamic random access memory ("DDR SDRAM"), data is transferred to or from other devices, where the data is synchronized with a clock signal (e.g., a reference clock or an external clock signal). The high speed source-synchronous semiconductor memory device performs an input or output operation in synchronization with not only a rising edge, but also a falling edge of the clock signal. Typically, in a system or a circuit including a semiconductor memory, the clock signal is used as a reference clock signal for adjusting operation timing to guarantee stable data access and data transfer without error. For stable data access and data transfer, the data transfer should occur with respect to the clock edges in such a way that the memory or physical layer ("PHY") can recover the data send synchronized to each clock edge. A delay locked loop ("DLL") can generate internal clock signals for the system based upon the reference clock signal by compensating for clock skew occurring in the data path and adding phase delays to the reference clock signal. The data path has a predetermined delay amount estimated from the clock skew, where the data or the clock signal passes through the semiconductor memory device. The generated internal clock signals can then be used for synchronizing data input/output.

DLLs can be used to supply these internal clock signals based on the reference clock signal. Typically, DLLs are based on a variable multi-stage delay line, in which the delay is controlled by a phase/frequency detector which compares the signal at the end of the delay line with the reference clock signal. It is appreciated that DLLs may also comprise of other components, including a charge pump and filter to name a couple. Taps between stages in the delay line provide multiple copies of the reference signal with various phase shifts so as to subdivide the clock period into different phase delay levels.

A DLL usually provides delays in steps up to a full clock cycle delay for the input signal. Typically, the DLL can have eight delay segments (also referred to as octants) or any other number of segments, e.g., 4 or 16 stages, that are connected in series to provide total delay up to one clock period. Each delay element of the DLLs can provide a delay of around $1/8^{th}$ of a full clock cycle (assuming it has 8-stages; if N-stages delay, then each can provide 1/N of a period). In particular, a DDR system's data strobe and data bits require alignment across the system. In order to do so, the DDR system typically implements a master-slave DLL network, where a master DLL sets the required delay times and can drive one or more slave delay lines for delaying signals, including a DQS strobe. Thus, the master DLL can force a specific delay onto the slave DLLs.

FIG. 1 illustrates a prior art master-slave delayed locked loop system. A master-slave delayed locked loop system of the prior art comprises a master delay locked loop ("MDLL") regulator 10, an MDLL 9, a slave delay locked loop ("SDLL") 32, a phase interpolator ("PI") array 34, and a SDLL regulator 36. The MDLL regulator 10 provides a stable and lower noise supply to the components used in the MDLL 9. The MDLL 9 comprises flip-flop ("FF") 12, FF 14, a delay logic 16, an AND gate 18, current sources 20 and 26, switch transistors 22 and 24, a filter capacitor 28, and master delay elements 30. The MDLL 9 uses a voltage control to adjust the delay elements of the master delay elements 30 for aligning signal CK0 with CK360. CK0 is usually a delayed version of the clock in signal CKIN_MDLL. The master delay elements 30 include delay elements as well as any logic or circuitry for the delay elements to function.

The MDLL 9 can generate slave bias currents for controlling one or more slave DLLs (e.g., the SDLL 32) based on the adjustments made to the master delay elements 30. The controlled SDLL 32 replicates the desired calibrations of the master delay elements 30 and applies it to a clock in signal CKIN_SDLL to generate its output clocks that have phase shifts from 0 degrees to 360 degrees. The phase shifted clock signals are inputted to the PI array 34 for generating clocks with much finer shifts in phase than can be provided by the delay lines themselves to use in clocking read and write commands and data. The SDLL regulator 36 can be used to provide information from the PI array 34 to the SDLL 32. The SDLL regulator 36 provides a stable supply to the components of the SDLL 32.

Due to the design and/or process, voltage and temperature ("PVT") fluctuations between the MDLL 9 and SDLL 32, the SDLL 32 may not operate identically as the MDLL 9. Thus the delay provided by the MDLL 9 is not exactly replicated in the SDLL 32, there will be differences in the set delays. For instance in DDR systems, data strobe and data bits need to be aligned across the system spanning several 100's μms such that the eye is maximized. There is usually one MDLL (or master phase locked loop) that generates the bias voltages or currents that determine the delay. This control bias is then distributed to various data macros where the local slave delay lines are used to align the strobe to the data byte.

DDR physical layer ("PHY") systems can easily span several 100's μm. Hence, the delay generated in the MDLL is substantially different from delay in slave DLLs due to PVT variations across these distances. These differences in delays will reduce the available valid timing eye for aligning data and strobes. Usually data strobe is aligned to data by delaying it by 90°-180° based on settings from the MDLL. At certain speeds, this delay difference can reduce the eye and be a significant issue, which can lead to read failures, write failures, and other failures.

Therefore, it is desirable to provide new circuits, methods, and systems for a clock alignment scheme to account for PVT variations in a slave DLL.

SUMMARY OF INVENTION

Briefly, the present disclosure discloses a master-slave delay locked loop system comprising a master delay locked loop ("MDLL") for generating at least one bias voltage and at least one slave delay locked loop ("SDLL"). The at least one SDLL is coupled to the MDLL, where the at least one SDLL comprises an analog to digital converter for converting the at least one bias voltage to at least one digital signal, an adder/subtractor block for adjusting the at least one digital signal based on at least one control signal, a digital to analog converter for converting the at least one adjusted digital signal to at least one analog signal, a voltage to current converter for converting the at least one analog signal to at least one bias current, delay elements for generating phase delayed signals based on the at least one bias current, and a phase detector and control logic for determining any phase difference between the phase delayed signals and for generating the at least one control signal to align the phase delayed signals.

DESCRIPTION OF THE DRAWINGS

The foregoing and other objects, aspects, and advantages of the invention can be better understood from the following detailed description of the preferred embodiment of the invention when taken in conjunction with the accompanying drawings in which.

DETAILED DESCRIPTION OF THE PREFERRED EMBODIMENTS

In the following detailed description of the embodiments, reference is made to the accompanying drawings, which form a part hereof, and in which is shown by way of illustration of specific embodiments in which the present invention may be practiced.

Figure 1:
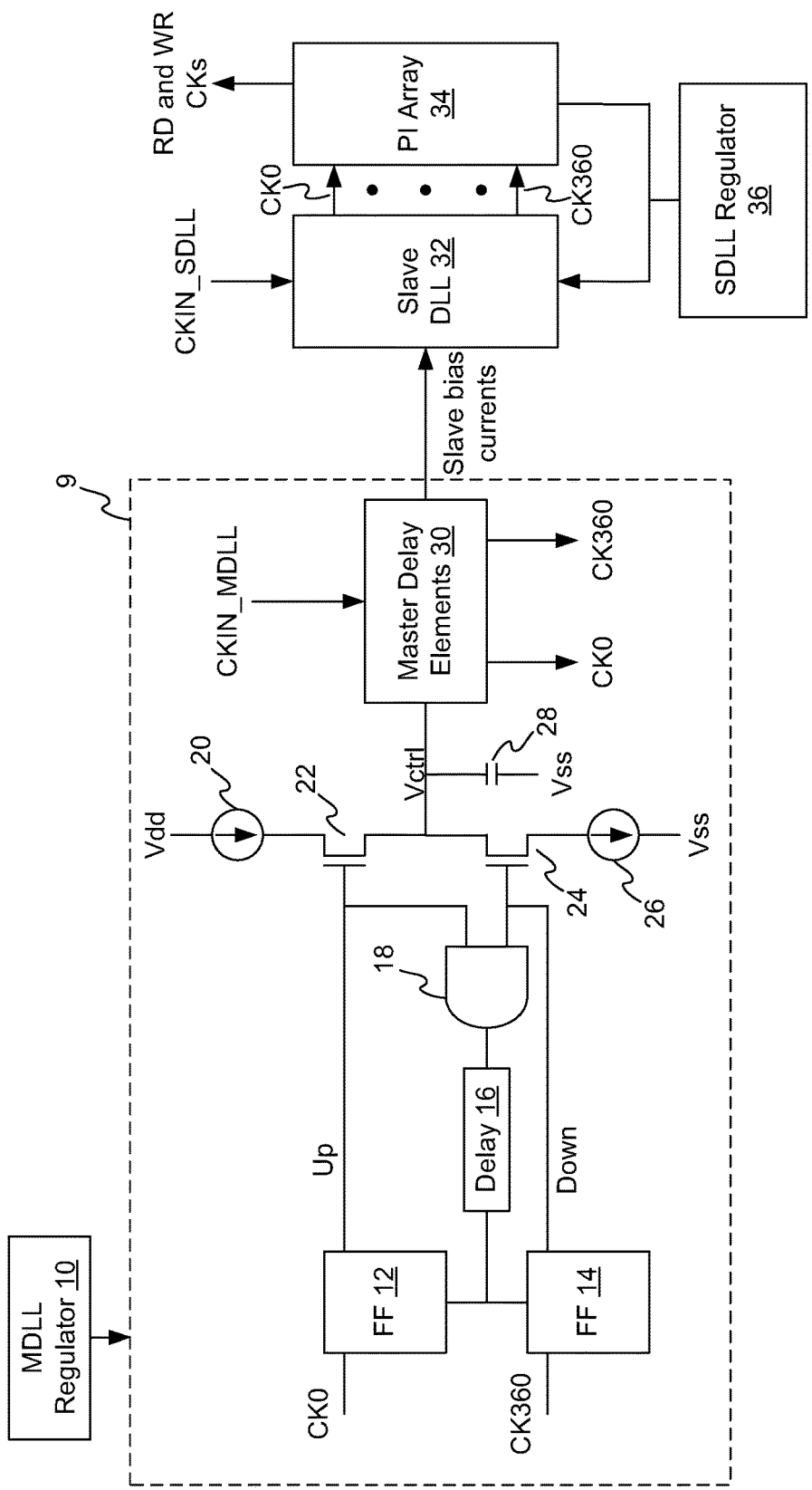
FIG. 1 illustrates a prior art master-slave delayed locked loop system.
Figure 2A:
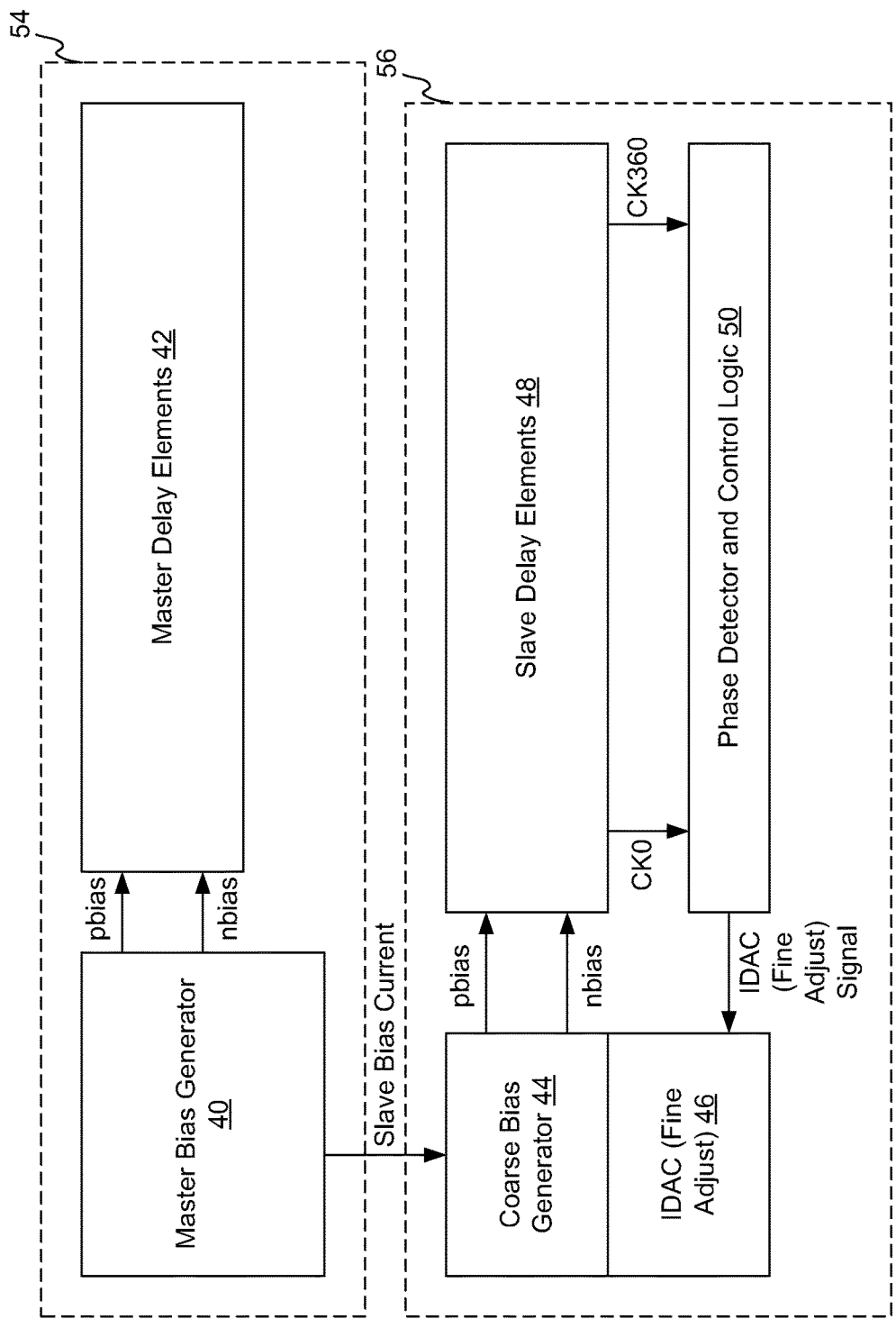
FIG. 2a illustrates a master-slave delay locked loop system of the present disclosure.

FIG. 2a illustrates a master-slave delay locked loop system of the present disclosure. A master-slave delay locked loop comprises a MDLL 54 and a SDLL 56. The MDLL 54 comprises a master bias generator 40 and master delay elements 42. The master bias generator 40 generates one or more bias signals to calibrate the master delay elements 42 and a slave bias signal to calibrate any delay elements of the SDLLs with similar calibrations. It is appreciated that the bias signal and the slave bias signal can each be a single bias or each be a plurality of biases depending on the implementation of the respective system.

The SDLL 56 comprises a coarse bias generator 44, a current digital-to-analog converter ("IDAC") 46 for fine adjust logic, slave delay elements 48, and a phase detector and control logic 50. The coarse bias generator 44, IDAC 46, and the phase detector and control logic 50 can be referred to as a slave calibration unit for providing a slave calibration loop. The coarse bias generator 44 receives the slave bias from the master bias generator 40, and can generate biases PBIAS and NBIAS to the slave delay elements 48. The coarse bias generator 44 can be implemented by a voltage to current converter or other mechanism for communicating the master biasing information to the SDLL 56 so that the SDLL 56 can apply similar biasing to the slave delay elements 48. In particular, the biases PBIAS and NBIAS control the delay between CLK0 and CLK360, or in other words the delay of the cell and can be implemented by currents and/or voltages. For the sake of understanding the present disclosure, a current-based bias implementation is disclosed. However, a person having ordinary skill in the art can implement a voltage-based bias signal in accordance with the present disclosure. Additionally, the biases PBIAS and NBIAS can be implemented using a single bias or additional biases depending on the implementation of the respective system.

The coarse bias generator 44 receives the slave bias, and translates that slave bias to generate the biases PBIAS and the NBIAS. The biases PBIAS and NBIAS are inputted to the slave delay elements 48. The slave delay elements 48 generate phase shifted signals from an inputted clock signal, including 0-degree-phase-shifted signal CK0 and the 360-degree-phase-shifted signal CK360. The 0-degree-phase-shifted signal CK0 and the 360-degree-phase-shifted signal CK360 are inputted to the phase detector ("PD") and control logic 50 for comparison. Ideally the CK0 and CK360 need to be phase aligned when the SDLL is locked. Any delay difference between the two signals are measured by the PD and control logic 50 and used to calibrate the slave delay elements 48 by outputting a fine adjust signal to the IDAC logic 46. The IDAC logic 46 can alter the biases PBIAS and NBIAS inputted to the slave delay elements 48 to improve phase alignment of the CK0 and CK360 signals.

For instance, the PD of the phase detector and control logic 50 measures whether CLK0 is leading (i.e., delay is more than a single period) or lagging CLK360 (i.e., delay is less than a single period). The output of the PD is sent to a respective control logic of the phase detector and control logic 50, which decodes the data and averages the PD outputs. The control logic also decides whether to increment or decrement the IDAC signal. This IDAC signal can then be used to add or subtract the coarse bias current of the coarse bias generator 44. Thereby, adjusting the biases PBIAS and NBIAS generated by the coarse bias generator 44, which further causes the delay to change in the delay elements 48. The slave calibration loop can be repeated until the clocks are very close in phase alignment.

The MDLL 54 can drive a plurality of SDLLs of the present disclosure. To aid in the understanding of the invention, a single SDLL is illustrated and described in conjunction with the MDLL. However, a plurality of SDLLs having a slave calibration loop can be coupled with the MDLL. Furthermore, it is possible to share components of the slave loop like the control logic between two or more SDLLs, but this may require some additional logic.

A person having ordinary skill in the art can apply the present disclosure to various clock alignment issues, including aligning internal clocks for DDR clocks, aligning pleisosynchronous systems through a clock and data recovery ("CDR") loop, etc. Even more so, it can be understood that the following disclosure can be used for aligning several clocks if needed by cascading such master-slave networks.

Figure 2B:
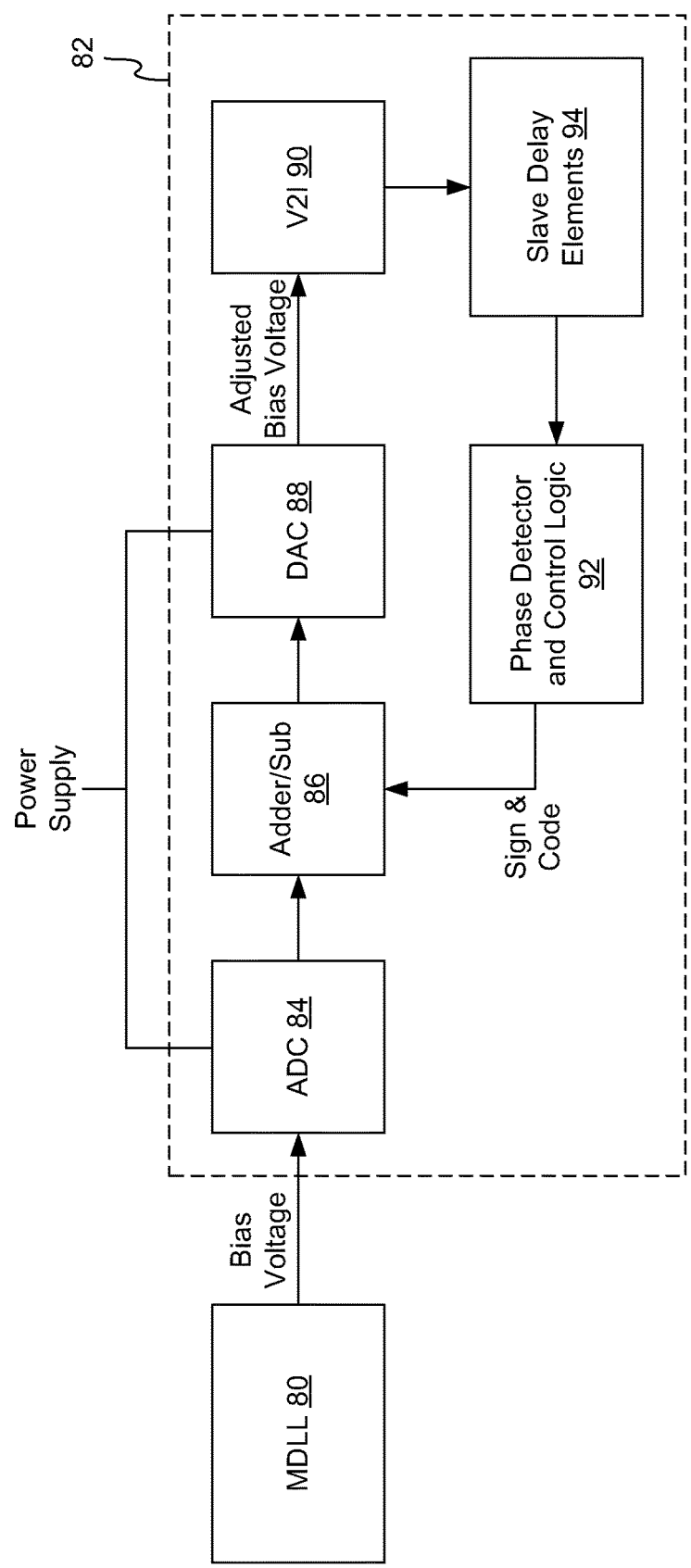
FIG. 2b illustrates another embodiment of a master-slave delay locked loop system of the present disclosure.

FIG. 2b illustrates another embodiment of a master-slave delay locked loop system of the present disclosure. In another embodiment, a single voltage-based bias signal can be outputted by a master DLL to a slave DLL of the present disclosure. The master-slave delay locked loop system of the present disclosure comprises a master DLL ("MDLL") 80 and a slave DLL ("SDLL") 82 where the SDLL 82 further comprises an analog-to-digital converter ("ADC") 84, an adder/subtractor ("adder/sub") 86, a digital-to-analog converter ("DAC") 88, a voltage-to-current converter ("V2I") 90, slave delay elements 94, and a phase detector and control logic 92. The coarse bias generator 44 and IDAC 46 of the previous example in FIG. 2a can be implemented in the instant FIG. 2b by the ADC 84, adder/sub 86, DAC 88, and V2I 90. Furthermore, the ADC 84, adder/sub 86, DAC 88, V2I 90, and phase detector and control logic 92 can be referred to as a slave calibration unit for providing a slave calibration loop.

Referring to FIG. 2b, the MDLL 80 generates a bias voltage for calibrating the slave delay elements 94. The ADC 84 converts the bias voltage to a digital bias signal. The digital bias signal is outputted to the adder/subtractor 86 for performing adding or subtracting functions on the inputted digital bias signal based on an inputted sign and code. The adder/sub 86 outputs an adjusted digital bias signal to the DAC 88. The DAC 88 converts the signal for output as an adjusted bias voltage to the V2I 90. The ADC 84 and the DAC 88 are powered by the same power level so that the codes for conversion are the same.

The V2I 90 converts the adjusted bias voltage to a current bias and outputs the current bias to the slave delay elements 94 for calibration of the slave delay elements 94. The slave delay elements 94 output phase delayed signals to the phase detector and control logic 92 to update the adjusted bias signals. The phase detector and control logic 92 can determine if the slave delay elements 94 require adjustment by comparing two more or more of its outputted phase delayed signals. Based on that comparison, the phase detector and control logic 92 output a sign and a code to the adder/sub 86 for applying that adjustment to generate the adjusted bias voltage. Thus, a feedback loop can be employed to make adjustments to the calibration of the slave delay elements 94.

Figure 3:
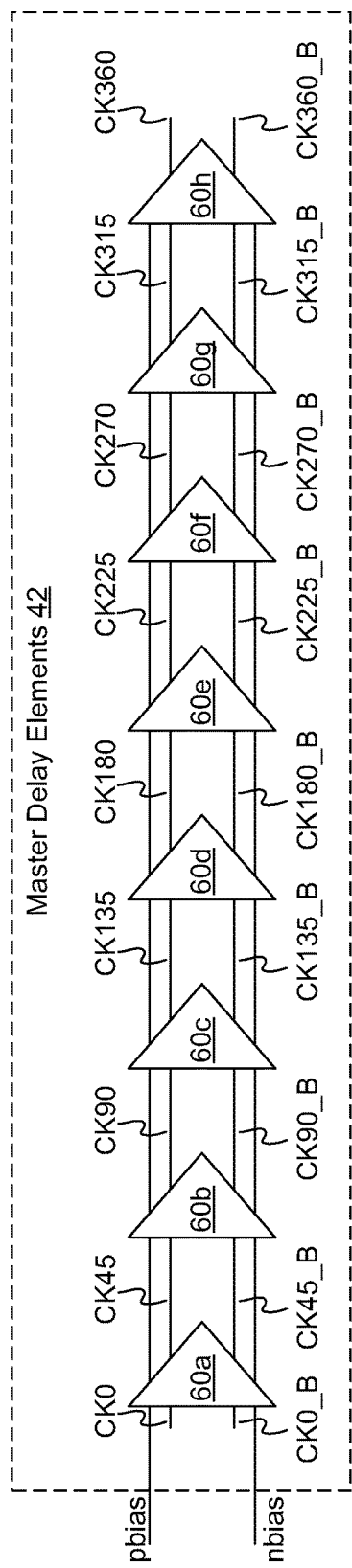
FIG. 3 illustrates master delay elements of a master-slave delay locked loop system of the present disclosure.

FIG. 3 illustrates master delay elements of a master-slave delay locked loop system of the present disclosure. The master delay elements 42 comprise delay buffers 60a-60h serially connected, where each of the buffers 60a-60h apply a predefined amount of delay to the inputted signal. For instance, each of the buffers 60a-60h can provide a 45 degree phase shift to its inputted signal such that the output of the first buffer 60a provides a 45-degree-phase-shifted signal of the inputted differential signal CK0 and CK0_B. The second buffer 60b applies another 45 degree phase shift such that it outputs a 90-degree-phase-shifted differential signal CK90 and CK90_B. The other buffers after the second buffer can also apply additional delays to further delay the inputted differential signal CK0 and CK0_B. The last buffer 60h can provide an additional 45 degree delay to provide for a 360-degree-phase-shifted differential signal CK360 and CK360_B relative to the input of the first buffer 60a. The biases PBIAS and NBIAS can adjust the calibration of the buffers 60a-60h to adjust for any variation in operation from its intended amount of phase shift. In particular, the biases PBIAS and NBIAS can adjust the delay of each delay element and hence the delay of the entire stage.

Figure 4:
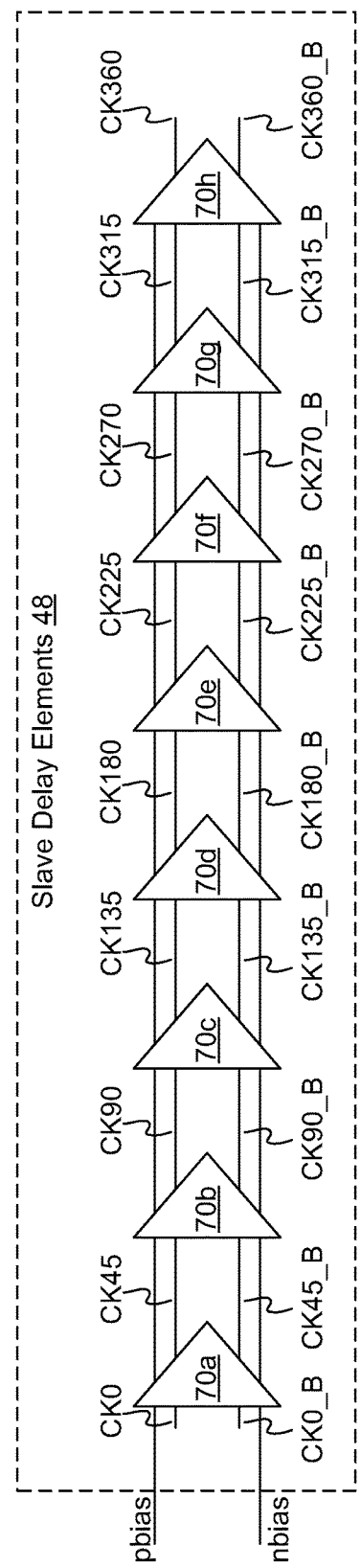
FIG. 4 illustrates slave delay elements of a master-slave delay locked loop system of the present disclosure.

FIG. 4 illustrates slave delay elements of a master-slave delay locked loop system of the present disclosure. The slave delay elements 48 comprise delay buffers 70a-70h serially connected, where each of the buffers 70a-70h apply a predefined amount of delay to the inputted signal. The delay buffers 70a-70h operate in a similar manner to the delay buffers 60a-60h. For instance, each of the buffers 70a-70h can provide a 45 degree phase shift to its inputted signal. The first buffer 70a can provide a 45 degree phase shifted signal of the inputted differential signal CK0 and CK0_B. The second buffer 70b applies another 45 degree phase shift such that it outputs a 90 degree-phase-shifted differential signal CK90 and CK90_B. The other buffers after the second buffer can also apply additional delays to further delay the inputted differential signal CK0 and CK0_B. The last buffer 70h can provide an additional 45 degrees delay to provide for a 360-degree-phase-shifted differential signal CK360 and CK360_B relative to the input of the first buffer 70a. The biases PBIAS and NBIAS can be adjusted to calibrate the amount of actual delay applied by the buffers 70a-70h. As stated above, PVT variations may cause the operation of the buffers 70a-70h to vary from its intended amount of phase shift.

In certain embodiments, the master delay elements and slave delay elements can be designed and implemented in the same manner, which can save time and effort. However, in other embodiments, the master delay elements and the slave delay elements can also be implemented differently depending on the design requirements of the respective system or device.

Figure 5:
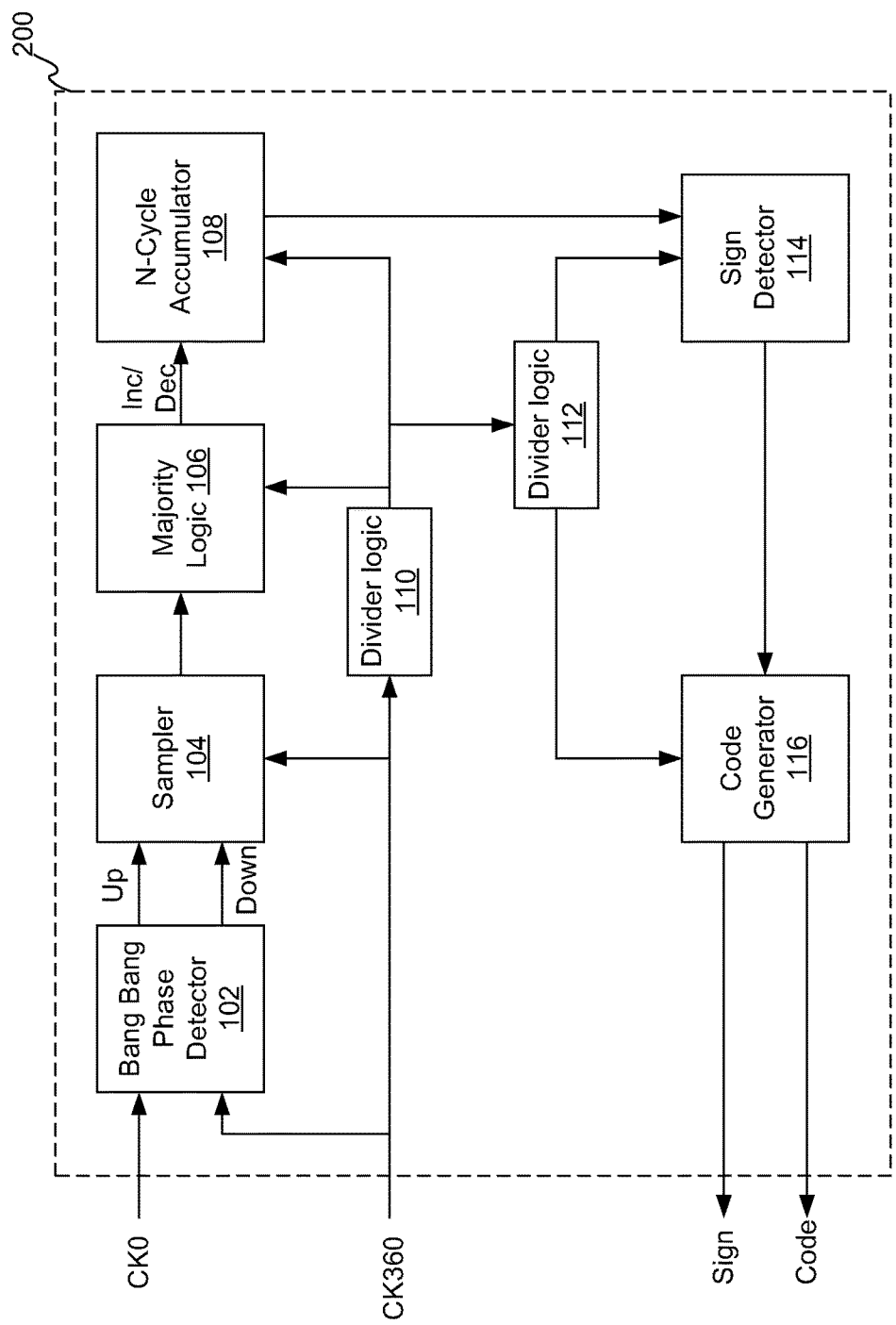
FIG. 5 illustrates an embodiment of a phase detector and control logic of the present disclosure for calibrating a slave delay locked loop.

FIG. 5 illustrates an embodiment of a phase detector and control logic of the present disclosure for calibrating a slave delay locked loop. The phase detector and control logic 200 comprises a bang-bang phase detector 102, a sampler 104, a majority logic 106, an accumulator 108, a first divider logic 110, a second divider logic 112, a sign detector 114, and a code generator 116. The phase detector and control logic 200 provide for a slave calibration loop to calibrate the delay elements of the SDLL 100.

The 0-degree-phase-shifted signal CK0 and the 360-degree-phase-shifted signal CK360 are outputted by the delay elements of the respective SDLL for input to the bang-bang phase detector 102. Depending on whether one of the signals are ahead or behind of the second one of the signals, an up or a down output signal can be provided by the bang-bang phase detector 102 to indicate such leading or lagging. For instance, if the CK360 signal comes before the CK0 signal (i.e., the delay cells are faster than 45° or the required phase for 1-period delay), a slow down ("Dn") signal is generated by the bang-bang phase detector 102. If the CK360 signal comes after the CK0 signal (i.e., delay cells are slower than 45° or the required phase for 1-period delay), a speed up ("Up") signal is generated by the bang-bang phase detector 102.

The sampler 104 samples the up or down signals from the bang-bang phase detector and is clocked by the CK360 signal. The sampler can be reset every predefined number of cycles (e.g., eight cycles). A majority logic 106 is used to determine whether a majority of the samples are up signals or are down signals for a period of time (e.g., for eight cycles of the output of the divider logic 110). If the majority logic samples an Up signal, a sampler value is incremented by outputting an increment signal to the accumulator 108. If the majority logic samples a Dn signal, the sampler value is decremented by outputting a decrement signal to the accumulator 108. The accumulator 108 increments or decrements the value based on the sampler output until time the accumulator 108 is reset, which can occur at a predefined amount of time (e.g., every m cycles) or at a programmable time. The CK360 signal can be divided by the divider 110 to generate a longer signal period to clock the majority logic 106, the accumulator 108, and the divider logic 112. The divider logic 112 further divides that inputted signal to clock the sign detector 114 and the code generator 116.

The accumulator outputs an accumulated decision made over N clock cycles (or another predefined number clock cycles) to the sign detector 114. The sign detector 114 outputs whether the calibration should be ahead or behind to the code generator 116. The code generator 116 converts that decision to a sign and a code for the adjusting the slave biasing of the respective SDLL to calibrate its delay elements such that the phase difference between the outputted CK0 and CK360. The sign and code values can be outputted to IDAC and/or the coarse bias generator for adjusting the slave bias signal(s).

For instance, the code can indicate to the SDLL to increment, decrement, lock detection, unlock detection, relock, and other commands for controlling the SDLL. In particular, for lock detection, the accumulator can provide a dither value for a programmable amount of time. The code can then be frozen, and a lock detection generated. For unlock detection, if the accumulator signals an increment up or down in another predefined number of consecutive cycles, then a de-assert lock detection code is generated and relocking can be performed. For a relock code indication, the relock indication can be user-based, counter-based, unlock-detection-based, or otherwise programmable.

The slave calibration loop can correct for both increasing delay and decreasing delay. The timing of the calibration can be programmable from a single time, to scheduled times, or even continuously. The SDLL calibration can thus reduce any PVT and Montecarlo mismatch.

While the present invention has been described with reference to certain preferred embodiments or methods, it is to be understood that the present invention is not limited to such specific embodiments or methods. Rather, it is the inventor's contention that the invention be understood and construed in its broadest meaning as reflected by the following claims. Thus, these claims are to be understood as incorporating not only the preferred apparatuses, methods, and systems described herein, but all those other and further alterations and modifications as would be apparent to those of ordinary skilled in the art.

We claim:

1. A master-slave delay locked loop system, comprising:
   a master delay locked loop ("MDLL") for generating at least one bias voltage; and
   at least one slave delay locked loop ("SDLL"),
   wherein the at least one SDLL is coupled to the MDLL, and
   wherein the at least one SDLL comprises:
      an analog to digital converter ("ADC") for converting the at least one bias voltage to at least one digital signal;
      an adder/subtractor block ("adder/sub block") for adjusting the at least one digital signal based on at least one control signal;
      a digital to analog converter ("DAC") for converting the at least one adjusted digital signal to at least one analog signal;
      a voltage to current converter ("V2I") for converting the at least one analog signal to at least one bias current;
      delay elements for generating phase delayed signals based on the at least one bias current; and
      a phase detector and control logic for determining any phase difference between the phase delayed signals and for generating the at least one control signal to align the phase delayed signals.

2. The master-slave delay locked loop system of claim 1 wherein the at least one bias voltage is coupled to an input of the ADC, wherein an output of the ADC is coupled to an input of the adder/sub block, wherein an output of the adder/sub block is coupled to an input of the DAC, wherein an output of the DAC is coupled to an input of the V2I, wherein an output of the V2I is coupled to the delay elements, wherein the delay elements have outputs coupled to the phase detector and control logic, and wherein an output of the phase detector and control logic is coupled to a control input of the adder/sub block.

3. The master-slave delay locked loop system of claim 1 wherein the at least one control signal comprises sign and code data for adjusting the at least one adjusted digital signal.

4. The master-slave delay locked loop system of claim 1 wherein the phase detector and control logic comprises:
   a bang-bang phase detector for comparing phases of a zero-degree clock signal ("CK0") and a three-hundred-sixty-degree clock signal ("CK360") from the delay elements;
   a sampler;
   a majority logic;
   an accumulator;
   a first divider logic;
   a second divider logic;
   a sign detector; and
   a code generator,
   wherein the sampler, the majority logic, and the accumulator are coupled together for indicating a phase difference between the CK0 and CK360 signals, and
   wherein the sign detector and the code generator are coupled together for generating the at least one control signal based on the phase difference.

5. The master-slave delay locked loop system of claim 4 wherein an input of the first divider logic is coupled to the CK360 signal for applying a divider function, and wherein an output of the first divider logic is coupled to the majority logic and the accumulator for clocking the majority logic and the accumulator.

6. The master-slave delay locked loop system of claim 5 wherein the output of the first divider logic is further coupled to an input of the second divider logic, and wherein an output of the second divider logic is coupled to the code generator and the sign detector for clocking the sign detector and the code generator.

7. A slave delay locked loop ("SDLL") comprising:
   an analog to digital converter ("ADC") for converting an at least one bias voltage from a master delay locked loop ("MDLL") to at least one digital signal;
   an adder/subtractor block ("adder/sub block") for adjusting the at least one digital signal based on at least one control signal;
   a digital to analog converter ("DAC") for converting the at least one adjusted digital signal to at least one analog signal;
   a voltage to current converter ("V2I") for converting the at least one analog signal to at least one bias current;
   delay elements for generating phase delayed signals based on the at least one bias current; and
   a phase detector and control logic for determining any phase difference between the phase delayed signals and for generating the at least one control signal to align the phase delayed signals.

8. The SDLL of claim 7 wherein the at least one bias voltage is coupled to an input of the ADC, wherein an output of the ADC is coupled to an input of the adder/sub block, wherein an output of the adder/sub block is coupled to an input of the DAC, wherein an output of the DAC is coupled to an input of the V2I, wherein an output of the V2I is coupled to the delay elements, wherein the delay elements have outputs coupled to the phase detector and control logic, and wherein an output of the phase detector and control logic is coupled to a control input of the adder/sub block.

9. The SDLL of claim 7 wherein the at least one control signal comprises sign and code data for adjusting the at least one adjusted digital signal.

10. The SDLL of claim 7 wherein the phase detector and control logic comprises:
   a bang-bang phase detector for comparing phases of a zero-degree clock signal ("CK0") and a three-hundred-sixty-degree clock signal ("CK360") from the delay elements;
   a sampler;
   a majority logic;
   an accumulator;
   a first divider logic;
   a second divider logic;
   a sign detector; and
   a code generator,
   wherein the sampler, the majority logic, and the accumulator are coupled together for indicating a phase difference between the CK0 and CK360 signals, and
wherein the sign detector and the code generator are coupled together for generating the at least one control signal.

11. The SDLL of claim 10 wherein an input of the first divider logic is coupled to the CK360 signal for applying a divider function, and wherein an output of the first divider logic is coupled to the majority logic and the accumulator for clocking the majority logic and the accumulator.

12. The SDLL of claim 11 wherein the output of the first divider logic is further coupled to an input of the second divider logic, and wherein an output of the second divider logic is coupled to the code generator and the sign detector for clocking the sign detector and the code generator.

13. A method for operating a master-slave delay locked loop system, comprising
   generating at least one bias voltage by a master delay locked loop ("MDLL");
   converting the at least one bias voltage by a slave delay locked loop ("SDLL") to at least one digital signal, wherein the SDLL comprises: an analog to digital converter ("ADC"), an adder/subtractor block ("adder/sub block"), a digital to analog converter ("DAC"), a voltage to current converter ("V2I"), delay elements for generating phase delayed signals based on the at least one bias current, and a phase detector and control logic;
   adjusting the at least one digital signal based on a control signal by the adder/sub block;
   converting the adjusted at least one digital signal to at least one analog signal by the DAC;
   converting the at least one analog signal to the at least one bias current by the V2I;
   generating phase delayed signals based on the at least one bias current by the delay elements;
   determining any phase difference between the phase delayed signals by the phase detector and control logic; and
   generating the control signal by the phase detector and control logic, wherein the control signal is inputted to the adder/sub block for aligning the phase delayed signals.

14. The method of operating the master-slave delay locked loop system of claim 13 wherein the at least one control signal comprises sign and code data.

15. The method of operating the master-slave delay locked loop system of claim 13 in the determining any phase difference step, further comprises the steps:
   comparing phases by a bang-bang phase detector of a zero-degree clock signal ("CK0") and a three-hundred-sixty-degree clock signal ("CK360") from the delay elements; and
   indicating a phase difference between the CK0 and CK360 signals.

16. The method of operating the master-slave delay locked loop system of claim 15 in the comparing phases step, wherein the bang-bang phase detector outputs a first logic signal to indicate when the CK360 signal is leading the CK0 signal and a second logic signal to indicate when the CK360 signal is lagging the CK0 signal.

17. The method of operating the master-slave delay locked loop system of claim 16, wherein the sampler samples an output of the bang-bang phase detector, and wherein the majority logic determines whether a majority of the samples from the sampler are the first logic signal or the second logic signal for a predefined period of time.

18. The method of operating the master-slave delay locked loop system of claim 17 wherein if the majority logic determines a majority of the first logic signal are sampled, a sampler value is incremented by generating an increment signal to the accumulator, and wherein if the majority logic determines a majority of the second logic signal are sampled, the sampler value is decremented by generating a decrement signal to the accumulator.

19. The method of operating the master-slave delay locked loop system of claim 18 wherein the accumulator outputs an accumulated decision to the sign detector, wherein the sign detector and the code generator generate a sign and a code for adjusting the at least one digital signal.

* * * * *